(12) United States Patent
Sugiura

(10) Patent No.: US 9,793,418 B2
(45) Date of Patent: Oct. 17, 2017

(54) SCHOTTKY BARRIER DIODE

(71) Applicant: ROHM CO., LTD., Kyoto (JP)

(72) Inventor: Hiroto Sugiura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/615,008

(22) Filed: Feb. 5, 2015

(65) Prior Publication Data

US 2015/0228809 A1 Aug. 13, 2015

(30) Foreign Application Priority Data

Feb. 10, 2014 (JP) ................. 2014-023571

(51) Int. Cl.
- H01L 29/872 (2006.01)
- H01L 29/47 (2006.01)
- H01L 29/40 (2006.01)
- H01L 29/66 (2006.01)

(52) U.S. Cl.
CPC ........ *H01L 29/8725* (2013.01); *H01L 29/407* (2013.01); *H01L 29/47* (2013.01); *H01L 29/66143* (2013.01); *H01L 29/872* (2013.01)

(58) Field of Classification Search
CPC ... H01L 2924/00; H01L 29/872; H01L 29/47; H01L 29/66143; H01L 29/1608; H01L 29/0619; H01L 2924/00014; H01L 29/1095; H01L 2224/48247
See application file for complete search history.

(56) References Cited

U.S. PATENT DOCUMENTS

| 2011/0227151 A1 | 9/2011 | Hsu et al. |
| 2012/0146055 A1* | 6/2012 | Mitani ............. H01L 29/0619 257/77 |

FOREIGN PATENT DOCUMENTS

| JP | 09283771 A | 10/1997 |
| JP | 2002-217426 A | 8/2002 |
| JP | 2008-300506 A | 12/2008 |
| JP | 2010-123741 A | 6/2010 |
| JP | 2011-142123 A | 7/2011 |
| JP | 2012-023199 A | 2/2012 |

* cited by examiner

Primary Examiner — Tony Tran
(74) Attorney, Agent, or Firm — Rabin & Berdo, P.C.

(57) ABSTRACT

A Schottky metal 9 is in Schottky-contact with a center portion of a surface of an epitaxial layer 4. A peripheral trench 13 is formed by digging from the surface of the epitaxial layer 4 on a boundary portion between an active region 21 where the Schottky metal 9 is in Schottky-contact with the surface of the epitaxial layer 4 and a peripheral region 22 outside of the active region in a surface layer portion of the epitaxial layer 4. An insulating film 14 is formed on an entire area of inner wall surfaces of the peripheral trench 13. There is provided with a conductor 15 which is connected to the Schottky metal 9 and is opposed to the entire area of the inner wall surfaces of the peripheral trench 13 via the insulating film 14 in the peripheral trench 13.

8 Claims, 15 Drawing Sheets

SCHOTTKY BARRIER DIODE

BACKGROUND OF THE INVENTION

1. Field of the Invention

The present invention relates to a Schottky barrier diode.

2. Description of the Related Art

A Schottky barrier diode includes an n-type semiconductor substrate, an n-type epitaxial layer formed on the n-type semiconductor substrate, and a Schottky metal which is in Schottky-contact with a surface of the n-type epitaxial layer. The surface of the n-type epitaxial layer includes an active region where the Schottky metal is in Schottky-contact with the surface of the n-type epitaxial layer, and a peripheral region outside thereof. When a reverse voltage is applied to the Schottky barrier diode, an electric field is concentrated on a boundary portion between the active region and the peripheral region. Therefore, in order to alleviate concentration of the electric field, a configuration is known where a p-type region (p-type guard ring) across the active region and the peripheral region is formed on the boundary portion between the active region and the peripheral region of a surface layer portion of the n-type epitaxial layer (see Patent Document 1: Japanese Unexamined Patent Publication No. 09-283771).

SUMMARY OF THE INVENTION

One of important properties of the Schottky barrier diode is that a leakage current is small at a time of applying the reverse voltage. Further, another important property is that a forward voltage for bringing into a conduction state is low. In order to decrease the leakage current of the Schottky barrier diode, it is preferable to increase a specific resistance of the n-type epitaxial layer. On the other hand, in order to decrease the forward voltage of the Schottky barrier diode, it is preferable to decrease a resistance of the n-type epitaxial layer which is presented as a product between the specific resistance of the n-type epitaxial layer and a thickness of the n-type epitaxial layer. That is, while the specific resistance of the n-type epitaxial layer can be decreased in order to decrease the forward voltage, the decreased specific resistance increases the leakage current. As a result, the leakage current and the forward voltage are in a trade-off relation.

In order to decrease the forward voltage without sacrificing the leakage current, it is better to make thin the thickness of the n-type epitaxial layer. However, this measure causes decrease of a reverse pressure resistance (hereinafter referred to merely as the "pressure resistance") of the Schottky barrier diode. Concretely speaking, at a time of applying the reverse voltage, a depletion layer is expanded from a Schottky junction surface of the active region, and at the same time, a depletion layer is expanded under the p-type region. However, the depletion layer under the p-type region is widely expanded lower than the depletion layer of the active region (on a side of the n-type semiconductor substrate). As a result, when the reverse voltage is increased, the depletion layer under the p-type region reaches the n-type semiconductor substrate before the depletion layer of the active region. Thus, the pressure resistance of the Schottky barrier diode is defined by a voltage at which a lower end of the depletion layer formed under the p-type region reaches the n-type semiconductor substrate at the time of applying the reverse voltage. Accordingly, when the thickness of the n-type epitaxial layer is made thin, the pressure resistance is lowered.

A subject of the present invention is to provide a Schottky barrier diode which can decrease a forward voltage without sacrificing a leakage current and easily ensures a required pressure resistance.

The Schottky barrier diode according to the present invention includes a Schottky barrier diode, comprising: a semiconductor substrate having a first conductivity type; an epitaxial layer having a first conductivity type which is formed on the semiconductor substrate and has an impurity concentration lower than that of the semiconductor substrate; a Schottky metal which is in Schottky-contact with a surface of the epitaxial layer; a peripheral trench formed by digging from the surface of the epitaxial layer in a boundary portion between an active region where the Schottky metal is in Schottky-contact with the surface of the epitaxial layer and a peripheral region outside of the active region; an insulating film formed on an entire area of inner wall surfaces of the peripheral trench; and a conductor which is connected to the Schottky metal and is opposed to the entire area of the inner wall surfaces of the peripheral trench via the insulating film.

In this configuration, the peripheral trench is formed in the boundary portion between the active region and the peripheral region, and the insulating film is formed on the entire area of the inner wall surfaces of the peripheral trench. Further, the conductor which is connected to the Schottky metal and is opposed to the entire area of the inner wall surfaces of the peripheral trench via the insulating film is provided in the peripheral trench. That is, a field plate structure is formed in the boundary portion between the active region and the peripheral region outside thereof. As a result, a portion immediately below the peripheral trench and outside of the side surfaces of the peripheral trench are depleted by field plate effect at a time of applying a reverse voltage. Therefore, concentration of an electric field can be alleviated in the boundary portion between the active region and the peripheral region.

Further, since the insulating film is formed on the inner wall surfaces of the peripheral trench, a thickness of a depletion layer formed immediately below the peripheral trench can be thinned at the time of applying the reverse voltage in comparison to the structure of Patent Document 1 where a region having a conductivity type different from a conductivity type of the epitaxial layer is formed at the boundary portion between the active region and the peripheral region on a surface layer portion of the epitaxial layer. As a result, the thickness of the epitaxial layer can be thinned without significantly worsening a pressure resistance. Consequently, a resistance of the epitaxial layer can be decreased without decreasing a specific resistance of the epitaxial layer. Thus, a forward voltage can be decreased without sacrificing a leakage current.

According to one embodiment of the present invention, the inner wall surfaces of the peripheral trench include side surfaces and a bottom surface of the peripheral trench.

According to one embodiment of the present invention, the peripheral trench has a shape of a quadrangular endless circle in plan view.

According to one embodiment of the present invention, a depth of a depletion layer formed immediately below the peripheral trench at a time of applying a reverse voltage is not larger than a depth of a depletion layer formed in the active region. According to this configuration, since a pressure resistance is defined by a depletion layer extended from the active region, an epitaxial layer can be thinned to a thickness corresponding to a thickness of a depletion layer below the active region. Consequently, a forward voltage can be further lowered. By looking from a different angle, a pressure resistance of a Schottky barrier diode can be heightened through providing an epitaxial layer having a certain thickness.

According to one embodiment of the present invention, a depth of a depletion layer formed immediately below the peripheral trench at a time of applying a reverse voltage is as approximately the same as a depth of a depletion layer formed in the active region. According to this configuration, since a lower end of a depletion layer formed in an epitaxial layer can be made planar at the time of applying the reverse voltage, a concentration of an electric field can be more effectively alleviated.

According to one embodiment of the present invention, the Schottky barrier diode is a planar Schottky barrier diode where the surface of the epitaxial layer being in Schottky-contact with the Schottky metal is planar. According to this configuration, since the epitaxial layer is thin, a forward voltage can be lowered.

According to one embodiment of the present invention, a plurality of inside trenches dug from the surface of the epitaxial layer are formed on the epitaxial layer in the active region, and the Schottky barrier diode is a trench junction Schottky barrier diode where the Schottky metal is formed to contact the surface of the epitaxial layer including the inner wall surfaces of the inside trench. According to this configuration, since an area of a junction surface between the Schottky metal and an epitaxial layer surface can be increased, a forward voltage can be decreased.

According to one embodiment of the present invention, a region having a second conductivity type which is different from a conductivity type of the epitaxial layer is not formed on a lower side of the peripheral trench, particularly in a region contacting the insulating film.

According to one embodiment of the present invention, the conductor is polysilicon.

DESCRIPTION OF THE PREFERRED EMBODIMENTS

Embodiments of the present invention are described in detail below while referring to accompanying drawings.

Figure 1:
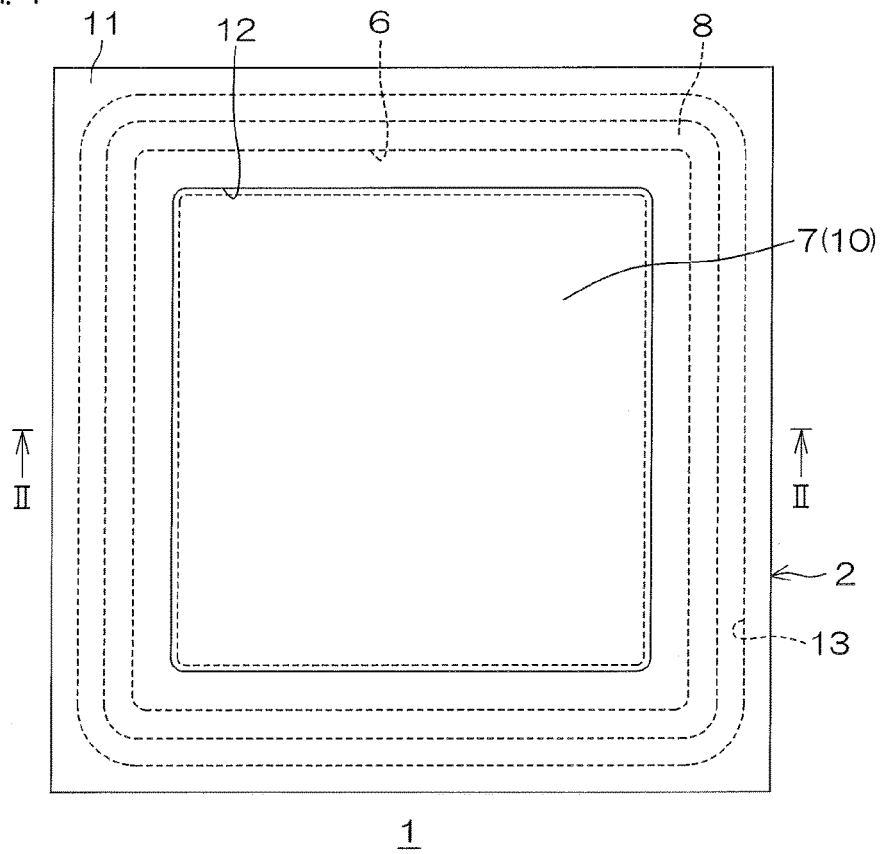
FIG. 1 is a schematic plan view showing a Schottky barrier diode according to a first embodiment of the present invention.
Figure 2:
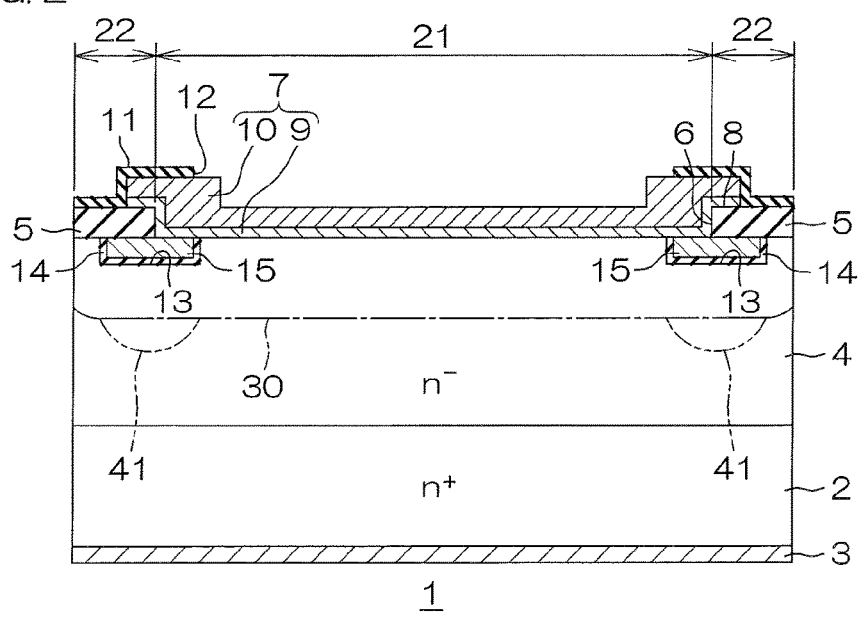
FIG. 2 is a sectional view along a line II-II in FIG. 1.

FIG. 1 is a plan view showing a Schottky barrier diode according to a first embodiment of the present invention. FIG. 2 is a sectional view along a line II-II in FIG. 1.

The Schottky barrier diode 1 is formed in a quadrangular chip shape in plan view, as shown in FIG. 1, for example. Each length of four sides of the Schottky barrier diode 1 in plan view is several millimeters, for example.

The Schottky barrier diode 1 comprises a semiconductor substrate 2 formed of n$^+$-type (whose n-type impurity concentration is $1\times10^{18}$ to $1\times10^{21}$ cm$^{-3}$, for example) silicone (Si). A cathode electrode 3 is formed on a rear surface of the semiconductor substrate 2 to cover an entire area thereof. The cathode electrode 3 is formed of a metal (Au, nickel (Ni) silicide and cobalt silicide, for example) which is brought into ohmic contact with an n-type silicone.

An epitaxial layer 4 formed of an n$^-$-type (whose n-type impurity concentration is $1\times10^{15}$ to $1\times10^{17}$ cm$^{-3}$, for example) silicone with a concentration lower than that of the semiconductor substrate 2 is laminated on a front surface of the semiconductor substrate 2. A thickness of the epitaxial layer 4 is 2 to 10 μm, for example.

A field insulating film 5 formed of oxide silicon (SiO$_2$) is laminated on a surface of the epitaxial layer 4. A thickness of the field insulating film 5 is, for example, 1,000 Å or more, and is preferably 7,000 to 40,000 Å. The field insulating film 5 may be formed of other insulator such as silicon nitride (SiN).

The field insulating film 5 is provided with an opening 6 which exposes a center portion of the epitaxial layer 4. An anode electrode 7 is formed on the field insulating film 5.

The anode electrode 7 is extended outside of the opening 6 in a flange shape to fill the opening 6 of the field insulating film 5 and cover a peripheral portion 8 of the opening 6 in the field insulating film 5 from above. That is, the peripheral portion 8 of the opening 6 in the field insulating film 5 is sandwiched from both of top and bottom sides thereof along an entire circumference by the epitaxial layer 4 and the anode electrode 7.

In this embodiment, the anode electrode 7 has a multi-layer structure (two-layer structure in this embodiment) of a Schottky metal 9 joined to the epitaxial layer 4 in the opening 6 of the field insulating film 5 and an electrode metal 10 laminated on this Schottky metal 9.

The Schottky metal 9 is formed of a metal (titanium (Ti), molybdenum (Mo) and palladium (Pd), for example) forming Schottky-junction by joint with an n-type silicone. The Schottky metal 9 joined to the epitaxial layer 4 forms a Schottky barrier (potential barrier) of 0.52 to 0.9 eV, for example, in relation to a silicon semiconductor configuring the epitaxial layer 4. A thickness of the Schottky metal 9 is, for example, 0.02 to 0.20 µm in this embodiment.

The electrode metal 10 is a portion of the anode electrode 7 which is exposed on an outermost surface of the Schottky barrier diode 1 to be joined by a bonding wire and the like. The electrode metal 10 is formed of aluminum (Al), for example. In this embodiment, a thickness of the electrode metal 10 is larger than that of the Schottky metal 9, and is 0.5 to 5.0 µm, for example.

The outermost surface of the Schottky barrier diode 1 is provided with a surface protection film 11 formed of SiN. A center portion of the surface protection film 11 is provided with an opening 12 which exposes the electrode metal 10. A bonding wire or the like is joined to the electrode metal 10 via this opening 12.

A region of the surface of the epitaxial layer 4 where the Schottky metal 9 is in Schottky-contact with the surface of the epitaxial layer 4 is referred to as an active region 21, and a region surrounding the active region 21 is referred to as a peripheral region 22. A surface layer portion of the epitaxial layer 4 is provided with a peripheral trench 13 dug from the surface of the epitaxial layer 4 in a boundary portion between the active region 21 and the peripheral region 22. The peripheral trench 13 has a circular shape (a quadrangular endless circle in this embodiment) in plan view, and is formed along a boundary of the active region 21 and the peripheral region 22 across the active region 21 and the peripheral region 22. A bottom surface of the peripheral trench 13 includes a planar surface along the surface of the epitaxial layer 4 and a surface of the semiconductor substrate 2. As a result, a section of the peripheral trench 13 has a generally rectangular shape.

An entire area of inner wall surfaces (side surfaces and the bottom surface) of the peripheral trench 13 is provided with an insulating film 14 formed of oxide silicon ($SiO_2$), for example. A thickness of the insulating film 14 is 0.2 to 0.5 µm, for example.

There is provided with a conductor 15 which is connected to the Schottky metal 9, is formed of polysilicon and is opposed to the entire area of the inner wall surfaces (including the side surfaces and the bottom surface) of the peripheral trench 13 via the insulating film 14 in the peripheral trench 13. The conductor 15 may be provided in a manner to fill an empty portion in the peripheral trench 13 where the insulating film 14 is provided, or may be formed as a film along an inner surface of the insulating film 14.

This Schottky barrier diode 1 is a planar Schottky barrier diode where the surface of the epitaxial layer 4 in Schottky-contact with the Schottky metal 9 is planar.

Figure 3:
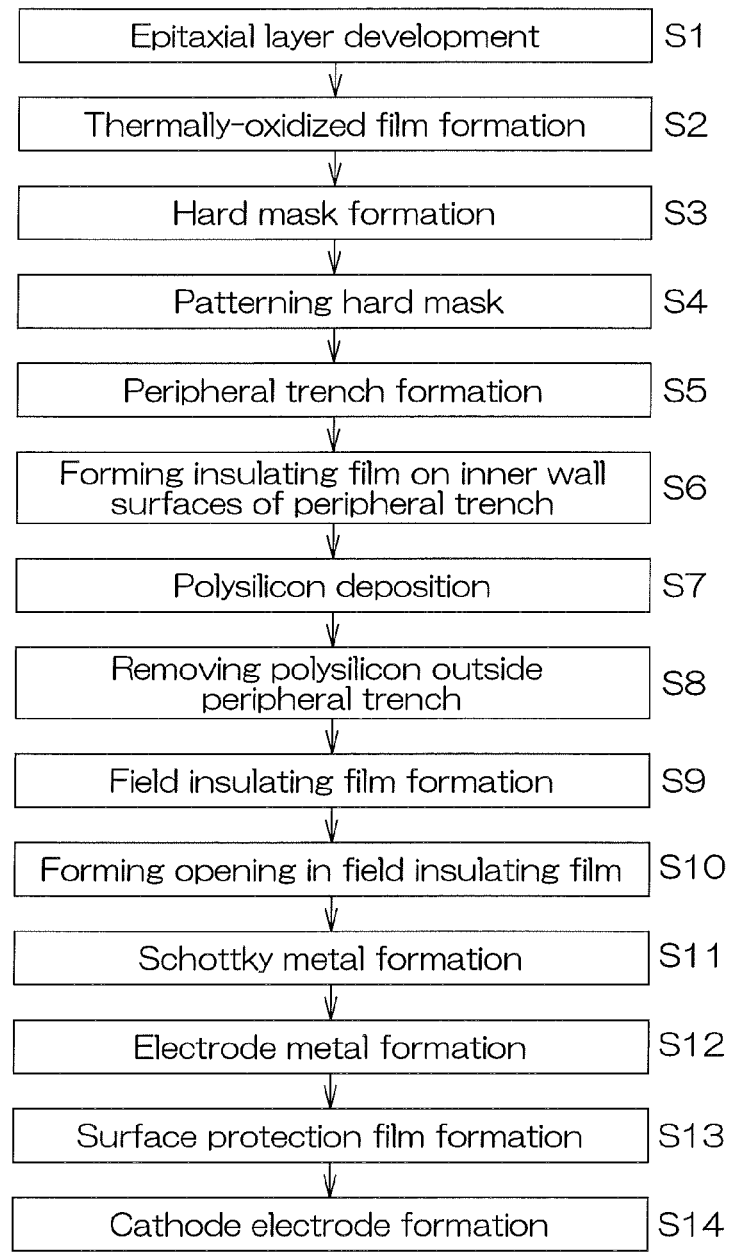
FIG. 3 is a flow chart for explaining a manufacturing process of the Schottky barrier diode in FIG. 1.

FIG. 3 is a process chart showing an example of a manufacturing process of the Schottky barrier diode 1.

First, there is prepared an $n^+$-type semiconductor wafer (not shown) as a source substrate of the semiconductor substrate 2. A plurality of Schottky barrier diode regions corresponding to a plurality of Schottky barrier diodes 1 are set in a matrix arrangement on a surface of the semiconductor wafer. A boundary region (scribe line) is provided between adjacent Schottky barrier diodes. The boundary region is a band-shaped region having an approximately constant width, and is extended in two orthogonal directions to be formed in a lattice shape. After a needed process is performed on the semiconductor wafer, the semiconductor wafer is cut off along the boundary region, whereby the plurality of Schottky barrier diodes 1 can be obtained. In this manner, a plurality of Schottky barrier diodes can be obtained from an $n^+$-type semiconductor wafer also in second and third embodiments described below.

First, an epitaxial layer 4 formed of $n^-$-type silicone is developed on an $n^+$-type silicon substrate ($n^+$-type semiconductor wafer) 2 (step S1). For example, P or As can be used as an n-type impurity.

Next, after a surface protecting thermally-oxidized film formed of $SiO_2$ is provided on a surface of the epitaxial layer 4, an alignment mark is formed at a predetermined portion on a scribe line of the surface protecting thermally-oxidized film (step S2). The alignment mark is used to align positions of a photomask and the wafer in following steps where photolithography is used.

Next, a hard mask formed of SiN and $SiO_2$ is provided by a CVD (Chemical Vapor Deposition) method, for example, on the surface protecting thermally-oxidized film (step S3).

Next, the hard mask is patterned by a photography technique and an etching technique thereby to form the hard mask corresponding to a pattern of a peripheral trench 13 (step S4). Then, the epitaxial layer 4 is etched through the hard mask thereby to form the peripheral trench 13 (step S5).

Next, an insulating film 14 formed of $SiO_2$ is provided by thermal oxidation on an entire area of inner wall surfaces (including side surfaces and a bottom surface) of the peripheral trench 13 (step S6). This insulating film 14 may be a combination of $SiO_2$ and PSG (Phosphorus Silicon Glass).

Next, polysilicon is deposited by the CVD method, for example, until the peripheral trench 13 is filled and the entire surface of the epitaxial layer 4 is covered (step S7). Then, polysilicon is removed from outside of the peripheral trench 13 by etch back (step S8).

Next, a field insulating film 5 formed of $SiO_2$ is provided on the epitaxial layer 4 (step S9). Then, the field insulating film 5 and the surface protecting thermally-oxidized film are etched using as a mask a resist pattern (not shown) formed by photolithography, thereby to form an opening 6 which exposes a center portion (active region) of the epitaxial layer 4 and a portion of a conductor 15 in the peripheral trench 13 (step S10).

Next, Ti is deposited on surfaces of the epitaxial layer 4 and the field insulating film 5 by a sputtering method, for example, and this Ti layer is patterned by photolithography, thereby to form a Schottky metal 9 (step S11). The Schottky metal 9 is formed in a manner to contact the conductor 15 and to cover an entire area of a surface of the epitaxial layer 4 in the opening 6.

Next, Al is deposited on the Schottky metal 9 by the sputtering method, for example, and this Al layer is patterned by photolithography, thereby to form an electrode metal 10 (step S12).

Next, an SiN layer is formed on surfaces of the electrode metal 10 and the field insulating film 5 by the CVD method, for example, and this SiN layer is patterned by photolithography, thereby to form a surface protection film 11 (step S13). Finally, a cathode electrode 3 is formed on a rear surface of the $n^+$-type silicon substrate 2 (step S14). As a result, there can be obtained the Schottky barrier diode 1 as shown in FIGS. 1 and 2.

In the Schottky barrier diode 1 of the first embodiment, the peripheral trench 13 is formed on the boundary portion between the active region 21 and the peripheral region 22, and the insulating film 14 is formed on the entire area of the inner wall surfaces of this peripheral trench 13. Further, there is provided with a conductor 15 which is connected to the Schottky metal 9 and is opposed to the entire area of the inner wall surfaces of the peripheral trench 13 via the insulating film 14 in the peripheral trench 13. That is, a field plate structure is formed on the boundary portion between the active region 21 and the peripheral region 22. As a result, a portion immediately below the peripheral trench and outside of the side surfaces of the peripheral trench are depleted by field plate effect at a time of applying a reverse voltage. Therefore, concentration of an electric field can be alleviated on the boundary portion between the active region 21 and the peripheral region 22.

Further, since the insulating film 14 is formed on the inner wall surfaces of the peripheral trench 13, a thickness of a depletion layer formed immediately below the peripheral trench 13 can be thinned at the time of applying the reverse voltage in comparison to the structure of Patent Document 1 where a region of a conductivity type different from a conductivity type of an epitaxial layer is formed on a boundary portion between an active region 21 and a peripheral region 22. As a result, the thickness of the epitaxial layer 4 can be thinned without significantly worsening a pressure resistance. Consequently, a resistance of the epitaxial layer 4 can be decreased without decreasing a specific resistance of the epitaxial layer 4. Consequently, a forward voltage can be decreased without sacrificing a leakage current.

Since the thickness of the depletion layer formed immediately below the peripheral trench 13 can be thinned at the time of applying the reverse voltage in comparison to a conventional structure, a depth of the depletion layer formed immediately below the peripheral trench 13 can be made as approximately the same as a depth of a depletion layer formed in the active region 21 at the time of applying the reverse voltage, as shown by alternate long and short dash lines 30 in FIG. 2. As a result, a lower end of a depletion layer formed in the epitaxial layer 4 can be made planar at the time of applying the reverse voltage, and therefore, the concentration of the electric field can be more effectively alleviated. Additionally, in a case like the structure of Patent Document 1 where a p-type region is provided on the boundary portion between the active region 21 and the peripheral region 22, a depth of a depletion layer formed immediately below the boundary portion between the active region 21 and the peripheral region 22 is larger than the depth of the depletion layer formed in the active region 21 at the time of applying the reverse voltage, as shown by alternate long and two short dashes lines 41 in FIG. 2.

Next, characteristics of the Schottky barrier diode 1 of the first embodiment are compared to characteristics of a comparative example. One where a p-type region (p-type guard ring) is formed was used as the comparative example in place of the field plate structure comprising the peripheral trench 13, the insulating film 14 and the conductor 15 in the Schottky barrier diode 1 shown in FIGS. 1 and 2.

Figure 4A:
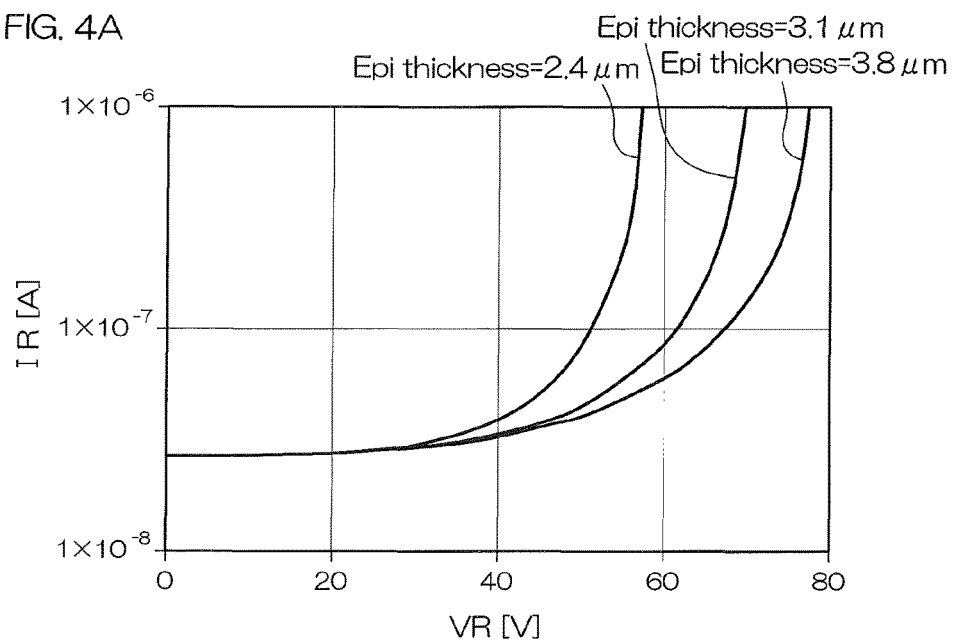
FIG. 4A is a graph showing voltage-current characteristics at a time of a reverse bias with respect to three types of samples which have a structure of the first embodiment and whose respective epitaxial layer thicknesses are different.
Figure 4B:
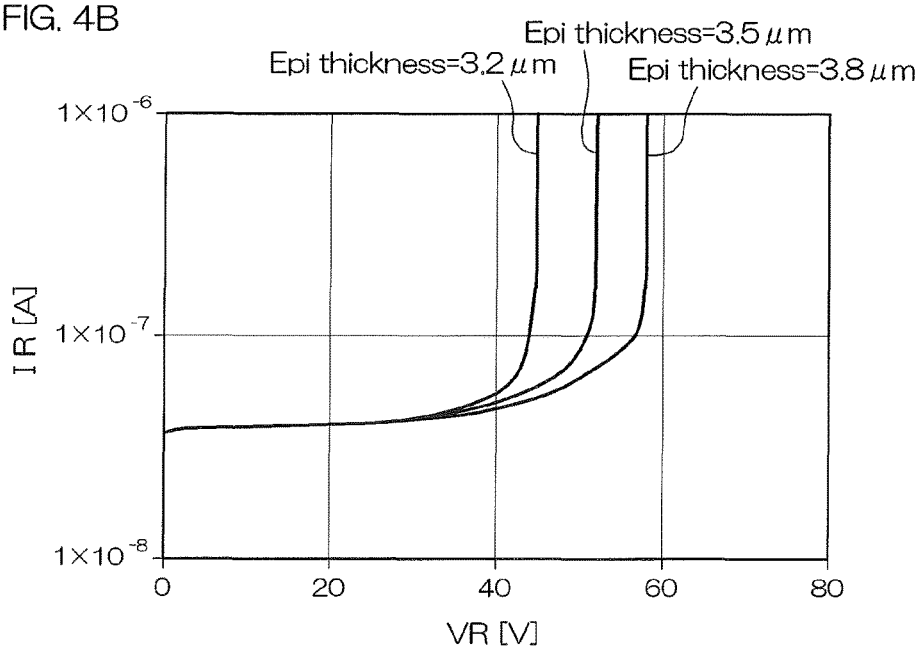
FIG. 4B is a graph showing voltage-current characteristics at a time of a reverse bias with respect to three types of samples which have a structure of a comparative example and whose respective epitaxial layer thicknesses are different.

FIG. 4A is a graph showing voltage-current characteristics (VR-IR characteristics) at a time of a reverse bias with respect to three types of samples which have a structure of the first embodiment and whose respective epitaxial layer thicknesses are different. FIG. 4B is a graph showing voltage-current characteristics (VR-IR characteristics) at a time of a reverse bias with respect to three types of samples which have a structure of a comparative example and whose respective epitaxial layer thicknesses are different. FIG. 4A shows VR-IR characteristics with respect to three types of samples where thicknesses of epitaxial layers 4 (hereinafter sometimes referred to as the "epitaxial layer thicknesses (Epi thicknesses)") are respectively 2.4, 3.1 and 3.8 µm. FIG. 4B shows VR-IR characteristics with respect to three types of samples where epitaxial layer thicknesses (Epi thicknesses) are respectively 3.2, 3.5 and 3.8 µm. It can be understood from FIG. 4A that in the first embodiment, leakage currents are not differentiated even when the epitaxial layer thicknesses are decreased.

Figure 5A:
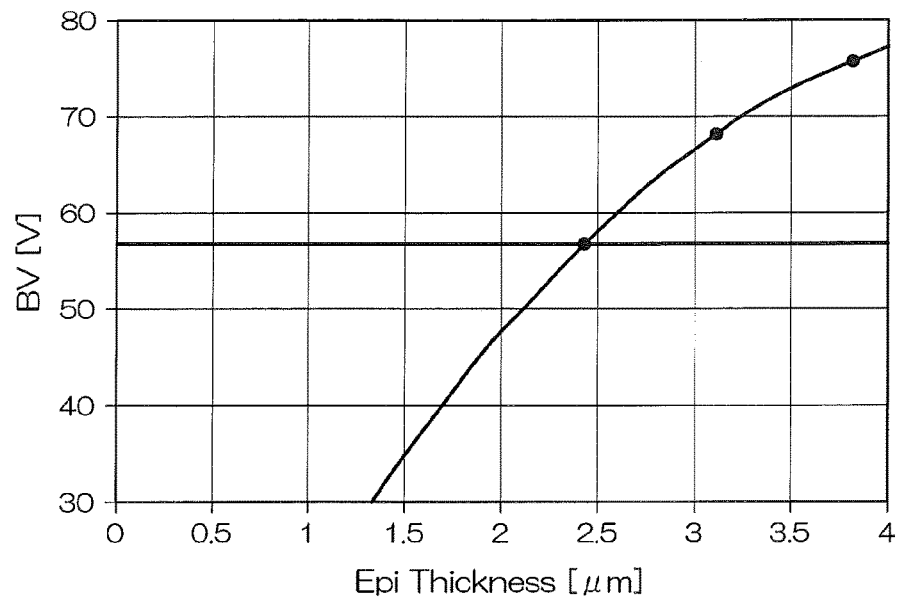
FIG. 5A is a graph showing a characteristic of a reverse pressure resistance with respect to an epitaxial layer thickness of the first embodiment.
Figure 5B:
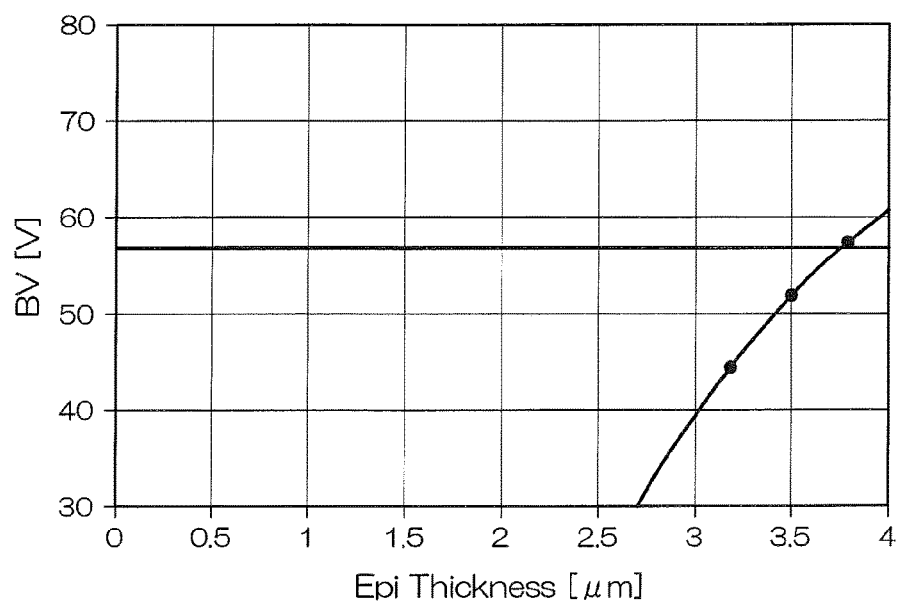
FIG. 5B is a graph showing a characteristic of a reverse pressure resistance with respect to an epitaxial layer thickness of the comparative example.

FIG. 5A is a graph showing a characteristic of a reverse pressure resistance (BV) with respect to an epitaxial layer thickness (Epi thickness) of the first embodiment. FIG. 5B is a graph showing a characteristic of a reverse pressure resistance (BV) with respect to an epitaxial layer thickness (Epi thickness) of the comparative example. The graph in FIG. 5A is made based on the VR-IR characteristics with respect to the three samples of FIG. 4A. The graph in FIG. 5B is made based on the VR-IR characteristics with respect to the three samples of FIG. 4B. A target value of the reverse pressure resistance is 57 V, for example.

In view of FIGS. 5A and 5B, in order to obtain the reverse pressure resistance of 57 V or more, the comparative example requires an epitaxial layer thickness of 3.8 µm or more, while the first embodiment only requires an epitaxial layer thickness of 2.4 µm or more. That is, an epitaxial layer thickness required to obtain the targeted reverse pressure resistance is thinner in the first embodiment than in the comparative example. As a result, an epitaxial layer thickness can be made thinner in the first embodiment than in the comparative example, a resistance of the epitaxial layer 4 can be decreased without decreasing a specific resistance of the epitaxial layer 4. Consequently, a forward voltage can be decreased without sacrificing a leakage current, and a Schottky barrier diode which easily ensures a required pressure resistance can be provided.

Figure 6:
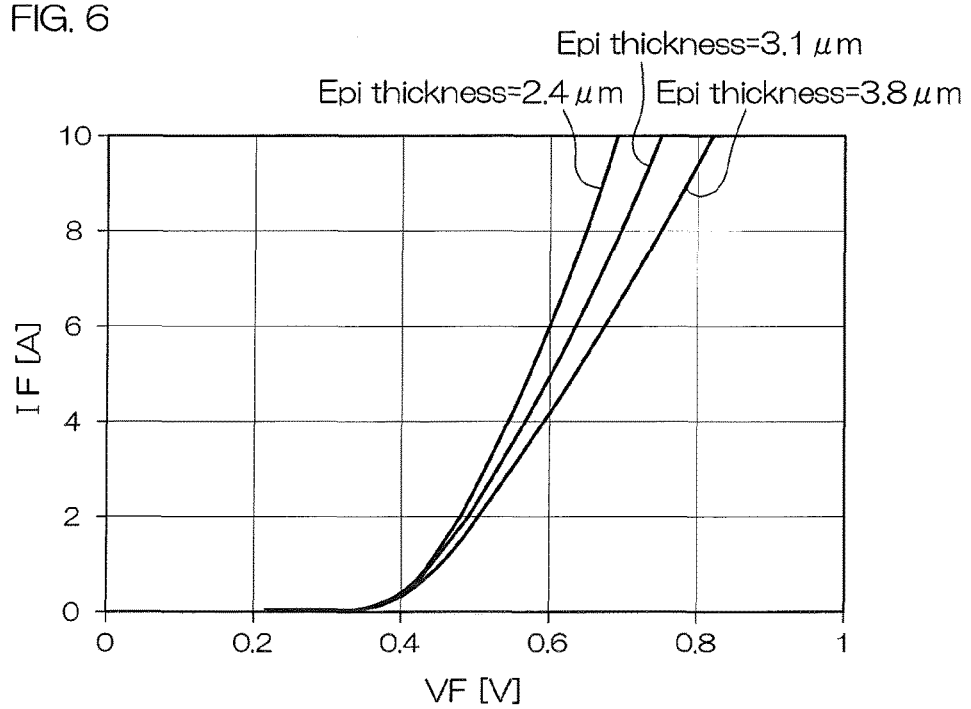
FIG. 6 is a graph showing voltage-current characteristics at a time of a forward bias with respect to three types of samples which have the structure of the first embodiment and whose respective epitaxial layer thicknesses are different.

FIG. 6 is a graph showing voltage-current characteristics (VR-IR characteristics) at a time of a forward bias with respect to three types of samples which have a structure of the first embodiment and whose respective epitaxial layer thicknesses are different. It can be understood from FIG. 6 that when an Epi thickness is made thin, a forward voltage is decreased in the first embodiment.

Figure 7:
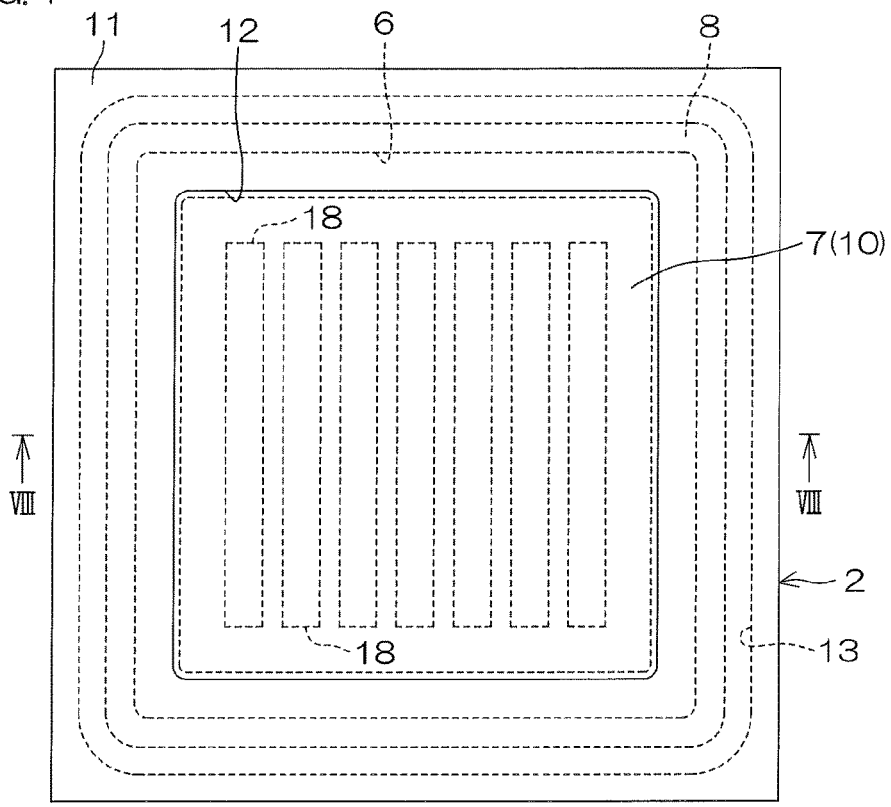
FIG. 7 is a schematic plan view showing a Schottky barrier diode according to a second embodiment of the present invention.
Figure 8:
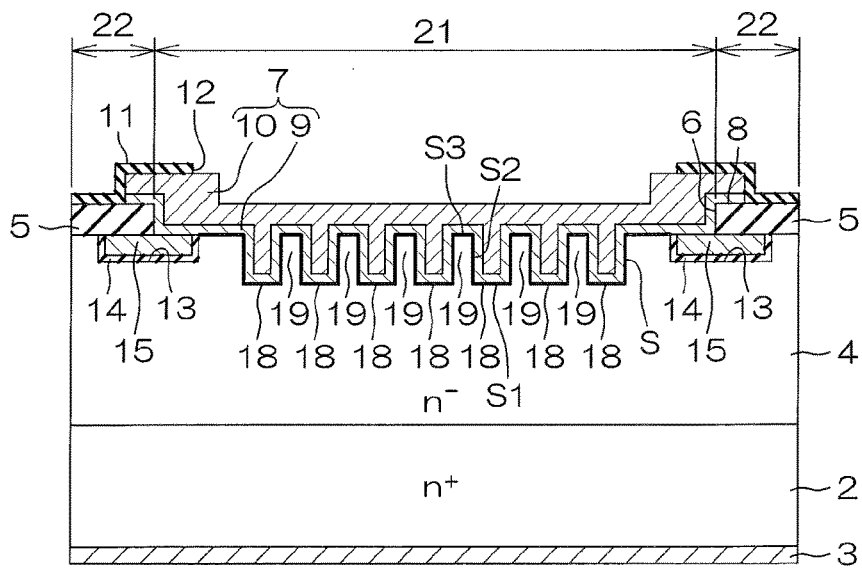
FIG. 8 is a sectional view along a line VIII-VIII in FIG. 7.

FIG. 7 is a schematic plan view showing a Schottky barrier diode according to a second embodiment of the present invention. FIG. 8 is a sectional view along a line VIII-VIII in FIG. 7. Portions in FIGS. 7 and 8 corresponding to the respective portions shown in above-described FIGS. 1 and 2 have the same reference symbols.

A Schottky barrier diode 1A of the second embodiment is different from the Schottky barrier diode 1 of the first embodiment in that a plurality of inside trenches 18 are formed in a surface layer portion of an epitaxial layer 4 on a region in an opening 6 of a field insulating film 5, and in that a Schottky metal 9 is formed to contact a surface of the epitaxial layer 4 including inner wall surfaces of each inside trench 18. That is, while the Schottky barrier diode 1 of the first embodiment is a planar Schottky barrier diode, the Schottky barrier diode 1A of the second embodiment is a trench junction Schottky barrier diode.

Points different from the first embodiment are described more specifically below. In this Schottky barrier diode 1A, the plurality of inside trenches 18 are formed by digging the epitaxial layer 4 from the surface thereof on the surface layer portion of the epitaxial layer 4 in the region within the opening 6 of the field insulating film 5. Each inside trench 18 is a longitudinal groove extending in a predetermined direction. A bottom surface of the inside trench 18 includes a planar surface along a surface of an n+-type silicon substrate 2. Therefore, a section of each inside trench 18 has a generally rectangular shape. In this embodiment, the plurality of inside trenches 18 are extended parallelly at a predetermined interval. Accordingly, these inside trenches 18 have a stripe shape in plan view. For example, side surfaces of the inside trenches 18 may be approximately parallel to a normal line of the surface of the epitaxial layer 4 (thickness direction of the epitaxial layer 4). In this case, in the region within the opening 6 of the field insulating film 5, a surface area of the epitaxial layer 4 is larger by the side wall surfaces of the inside trenches 18 in comparison to a case where the inside trenches 18 are not formed.

A mesa portion 19 is formed at a portion sandwiched by adjacent inside trenches 18 on the surface layer portion of the epitaxial layer 4. When the inside trenches 18 have a section of a generally rectangular shape, the mesa portion 19 has accordingly a section of a generally rectangular shape. Each mesa portion 19 has a pair of side wall surfaces (side surfaces of the inside trench 18) which rise, for example, approximately vertically from respective one side edges of the bottom surface of an adjacent pair of inside trenches 18, and has a top surface (the surface of the epitaxial layer 4) coupling these pair of side wall surfaces.

The Schottky metal 9 is formed to contact the surface of the epitaxial layer 4 including the inner wall surfaces of the inside trench 18 (including the side surfaces and the bottom surface). Accordingly, the Schottky metal 9 is in contact with the surface of the epitaxial layer 4 on the inner wall surfaces of all the inside trenches 18 and outside of the inside trenches 18. Further, the Schottky metal 9 covers an entire area of the inner wall surfaces of each inside trench 18 and extends continuously to outside of the inside trenches 18. That is, the Schottky metal 9 is joined to the surface of the epitaxial layer 4 exposed from the opening 6 in a manner to cover an entire area thereof. In this embodiment, the Schottky metal 9 includes a bottom surface portion contacting the bottom surface of the inside trench 18, side surface portions contacting the side surfaces of the inside trench 18 (the side wall surfaces of the mesa portion 19), and a top surface portion contacting the top surface of the mesa portion 19.

In this case, a junction surface (a Schottky junction surface) S between the Schottky metal 9 and the surface of the epitaxial layer 4 is formed to have a concavo-convex section. Accordingly, a surface area of the Schottky junction surface S is larger than an apparent area of the epitaxial layer 4 in a plan view where the surface of the epitaxial layer 4 (a portion extending horizontally in FIG. 8) is looked down in the normal line thereof. More specifically, the Schottky junction surface S includes a bottom surface portion S1 contacting the bottom surface of the inside trench 18, side surface portions S2 contacting the side surfaces of the inside trench 18 (the side wall surfaces of the mesa portion 19), and a top surface portion S3 contacting the top surface of the mesa portion 19. When the inside trenches 18 have a section of a generally rectangular shape, the area of the Schottky junction surface S can be increased by the side wall surfaces S2 in comparison to a case where the inside trenches 18 are not formed.

An electrode metal 10 is embedded in each inside trench 18 to contact the Schottky metal 9 covering the inner wall surfaces of each inside trench 18. On the other hand, a surface of the electrode metal 10 opposite to aside contacting the Schottky metal 9 is planar along the surface of the epitaxial layer 4 (except the inner wall surfaces of the inside trench 18).

In the surface of the epitaxial layer 4, a region where the Schottky metal 9 is in Schottky-contact with the surface of the epitaxial layer 4 is an active region 21, and a region which surrounds the active region 21 is a peripheral region 22. Also in the second embodiment, a field plate structure comprising a peripheral trench 13, an insulating film 14 and a conductor 15 is formed on a boundary portion between the active region 21 and the peripheral region 22 in the surface layer portion of the epitaxial layer 4, similarly to the first embodiment.

Figure 9:
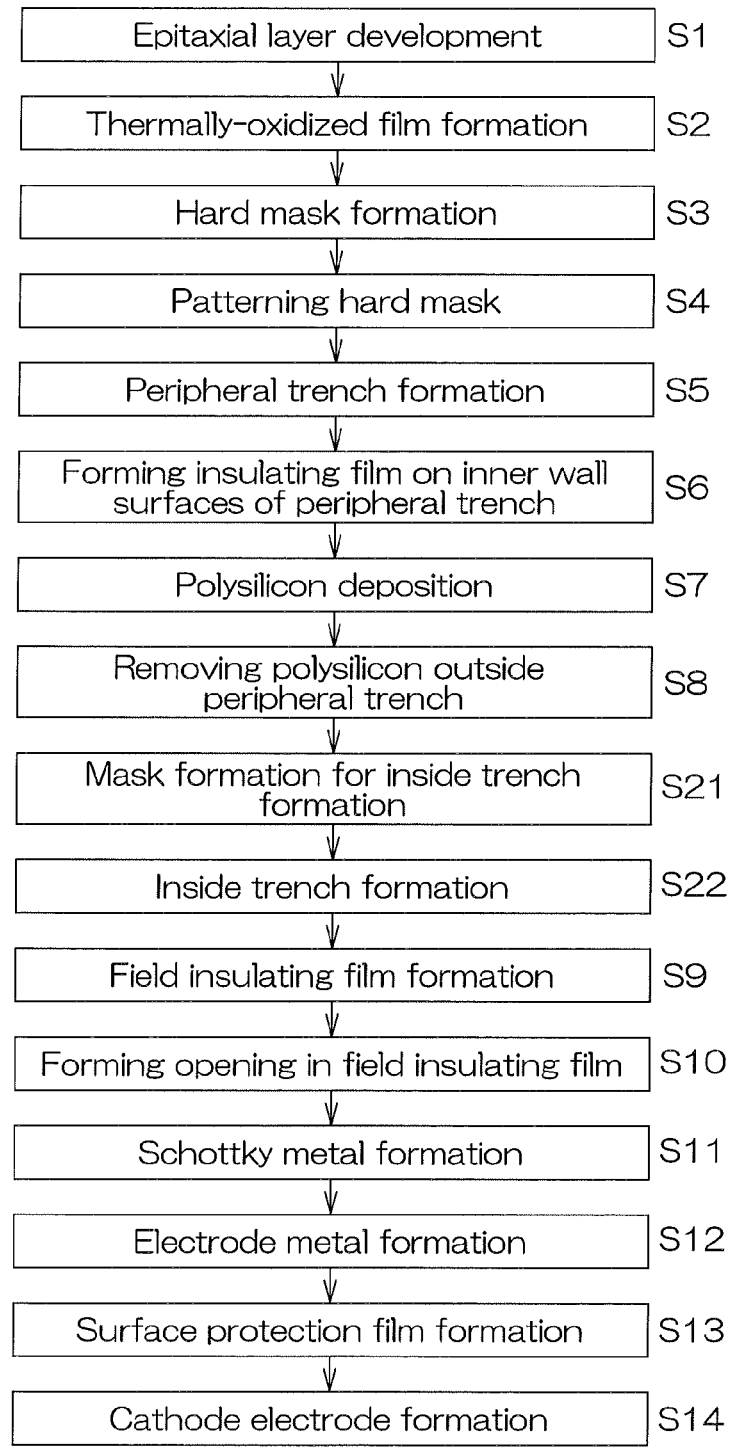
FIG. 9 is a flow chart for explaining a manufacturing process of the Schottky barrier diode in FIG. 7.

FIG. 9 is a process chart showing an example of a manufacturing process of the Schottky barrier diode 1A. In FIG. 9, steps corresponding to the respective steps in FIG. 3 have the same step numbers as those in FIG. 3.

First, an epitaxial layer 4 formed of n⁻-type silicone is developed on an n⁺-type silicon substrate (n⁺-type semiconductor wafer) 2 (step S1). Next, after a surface protecting thermally-oxidized film formed of $SiO_2$ is provided on a surface of the epitaxial layer 4, an alignment mark is formed at a predetermined portion on a scribe line of the surface protecting thermally-oxidized film (step S2). The alignment mark is used to align positions of a photomask and a wafer in following steps where photolithography is used. Then, a hard mask formed of SiN and $SiO_2$ is provided by the CVD method, for example, on the surface protecting thermally-oxidized film (step S3).

Next, the hard mask is patterned by the photography technique and the etching technique thereby to form the hard mask corresponding to a pattern of a peripheral trench 13 (step S4). Then, the epitaxial layer 4 is etched through the hard mask thereby to form the peripheral trench 13 (step S5).

Next, an insulating film 14 formed of oxide silicon ($SiO_2$) is provided by thermal oxidation on an entire area of inner wall surfaces (side surfaces and a bottom surface) of the peripheral trench 13 (step S6).

Next, polysilicon is deposited by the CVD method, for example, until the peripheral trench 13 is filled and the entire surface of the epitaxial layer 4 is covered (step S7). Then, polysilicon is removed from outside of the peripheral trench 13 by etch back (step S8).

Next, a mask corresponding to a pattern of the inside trenches 18 by photography (step S21). Then, the inside trenches 18 are formed by etching the epitaxial layer 4 via this mask (step S22).

Next, a field insulating film 5 formed of $SiO_2$ is provided on the epitaxial layer 4 (step S9). Then, the field insulating film 5 and the surface protecting thermally-oxidized film are etched using as a mask a resist pattern (not shown) formed by photolithography, thereby to form an opening 6 which exposes a center portion (active region) of the epitaxial layer 4 and a portion of a conductor 15 in the peripheral trench 13 (step S10).

Next, Ti is deposited on surfaces of the epitaxial layer 4 and the field insulating film 5 by the sputtering method, for example, and this Ti layer is patterned by photolithography, thereby to form a Schottky metal 9 (step S11). The Schottky metal 9 is formed in a manner to contact the conductor 15 and to cover an entire area of the surface of the epitaxial layer 4 in the opening 6.

Next, Al is deposited on the Schottky metal 9 by the sputtering method, for example, and this Al layer is patterned by photolithography, thereby to form an electrode metal 10 (step S12).

Next, an SiN layer is formed on surfaces of the electrode metal 10 and the field insulating film 5 by the CVD method, for example, and this SiN layer is patterned by photolithography, thereby to form a surface protection film 11 (step S13). Finally, a cathode electrode 3 is formed on a rear surface of the $n^+$-type silicon substrate 2 (step S14). As a result, there can be obtained the Schottky barrier diode 1A as shown in FIGS. 7 and 8.

An effect similar to the Schottky barrier diode 1 of the first embodiment can be obtained also in the Schottky barrier diode 1A of the second embodiment. Further, in the Schottky barrier diode 1A of the second embodiment, since an area of a junction surface (Schottky junction surface) between the Schottky metal 9 and the surface of the epitaxial layer 4 can be increased in comparison to a planar Schottky barrier diode, a forward voltage can be decreased.

Figure 10:
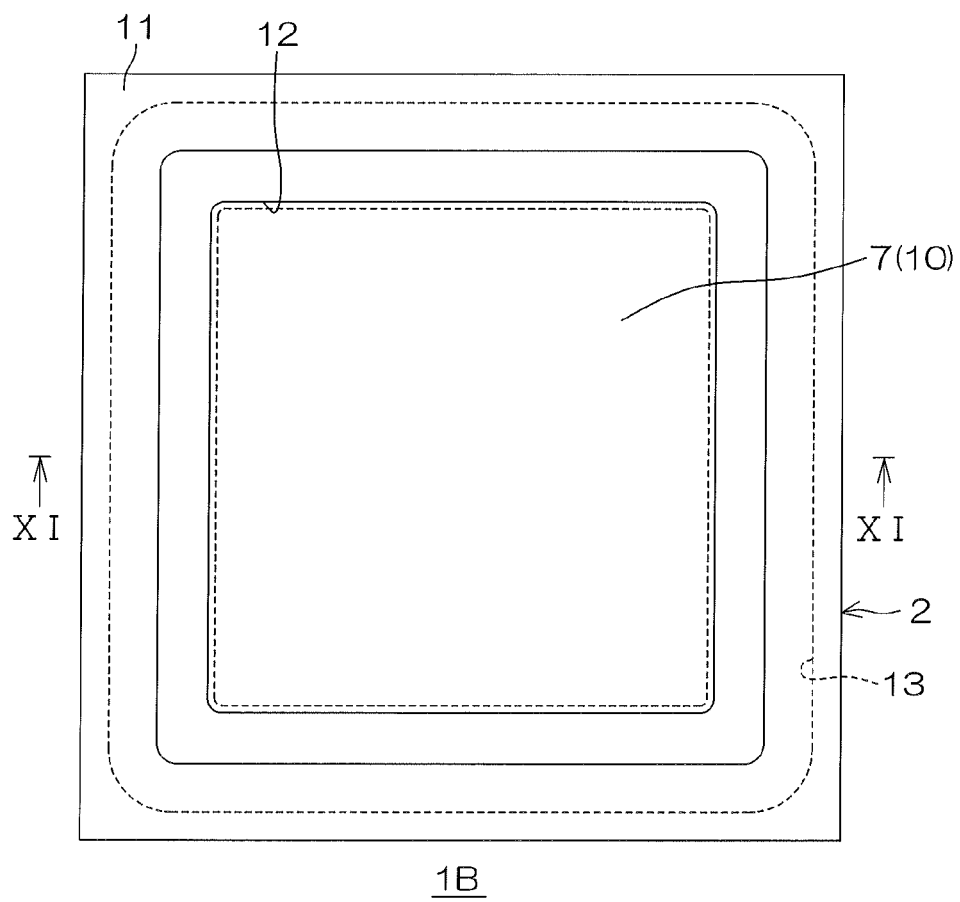
FIG. 10 is a schematic plan view showing a Schottky barrier diode according to a third embodiment of the present invention.
Figure 11:
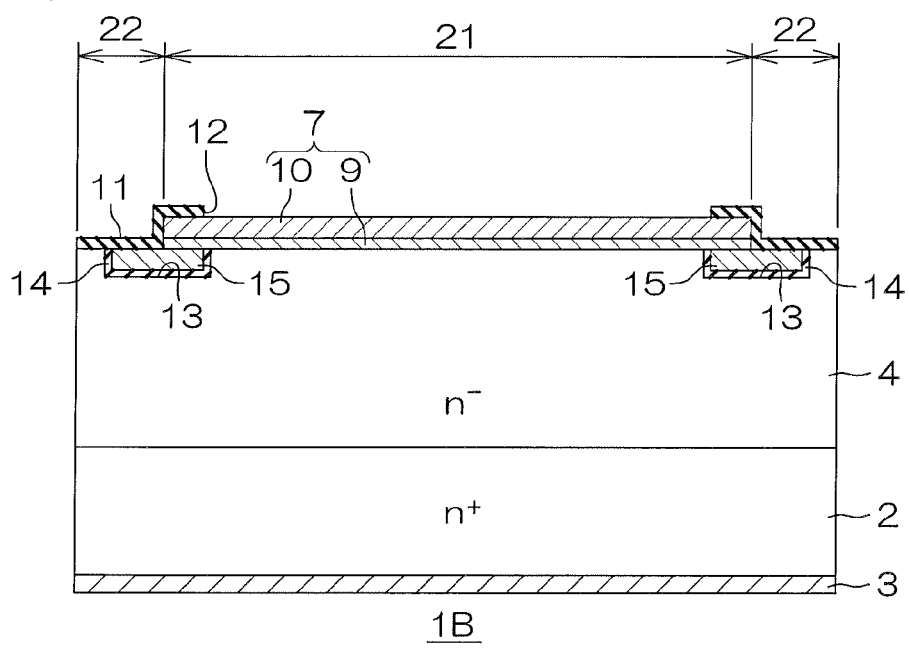
FIG. 11 is a sectional view along a line XI-XI in FIG. 10.

FIG. 10 is a plan view showing a Schottky barrier diode according to a third embodiment of the present invention. FIG. 11 is a sectional view along a line XI-XI in FIG. 10. Portions in FIGS. 10 and 11 corresponding to the respective portions shown in above-described FIGS. 1 and 2 have the same reference symbols.

A Schottky barrier diode 1B of the third embodiment is different from the Schottky barrier diode 1 of the first embodiment in that a field insulating film is not formed on a peripheral portion of an epitaxial layer 4.

Points different from the first embodiment are described more specifically below. In this Schottky barrier diode 1B, an anode electrode 7 which is quadrangular in plan view is formed on a center region except a peripheral portion of a surface of the epitaxial layer 4. The anode electrode 7 has a multi-layer structure (two-layer structure in this embodiment) of a Schottky metal 9 being in Schottky junction with the epitaxial layer 4 and an electrode metal 10 laminated on this Schottky metal 9.

An outermost surface of the Schottky barrier diode 1B is provided with a surface protection film 11 formed of SiN. A center portion of the surface protection film 11 is provided with an opening 12 which exposes the electrode metal 10.

In the surface of the epitaxial layer 4, a region where the Schottky metal 9 is in Schottky-contact with the surface of the epitaxial layer 4 is an active region 21, and a region which surrounds the active region 21 is a peripheral region 22. Also in the third embodiment, a field plate structure comprising a peripheral trench 13, an insulating film 14 and a conductor 15 is formed on a boundary portion between the active region 21 and the peripheral region 22 in a surface layer portion of the epitaxial layer 4, similarly to the first embodiment.

Figure 12:
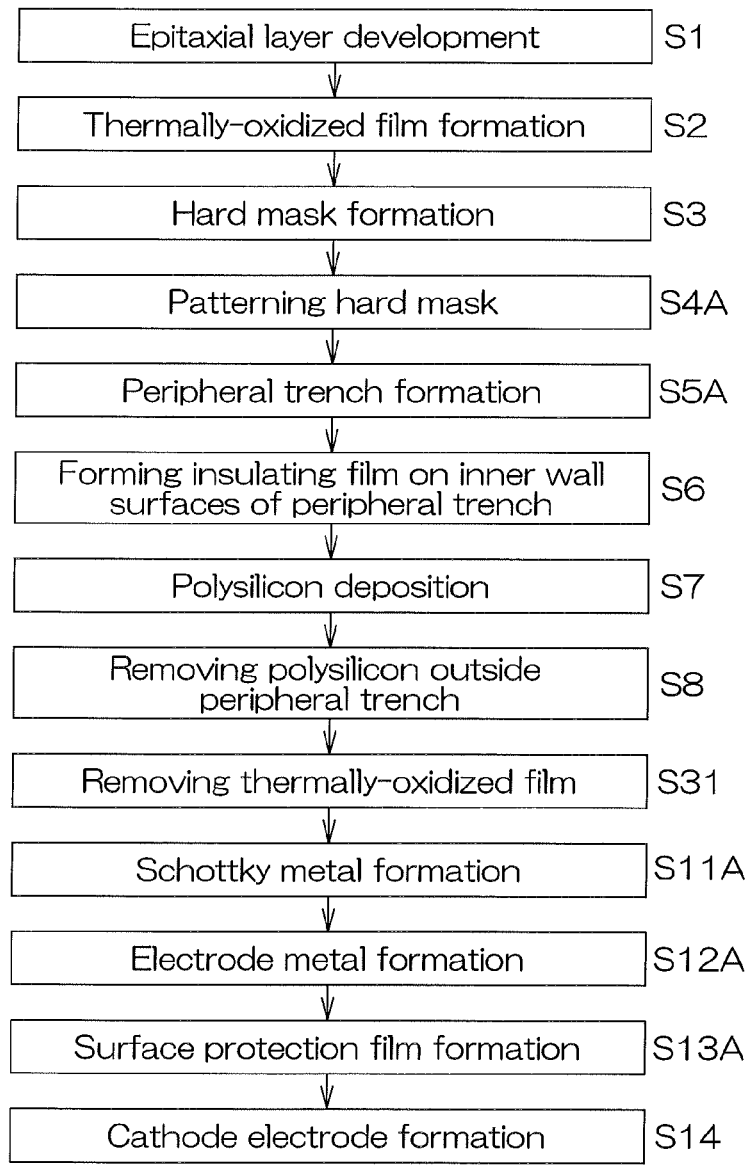
FIG. 12 is a flow chart for explaining a manufacturing process of the Schottky barrier diode in FIG. 10.

FIG. 12 is a process chart showing an example of a manufacturing process of the Schottky barrier diode 1B. In FIG. 12, steps corresponding to the respective steps in FIG. 3 have the same step numbers as those in FIG. 3.

First, an epitaxial layer 4 formed of $n^-$-type silicone is developed on an $n^+$-type silicon substrate 2 (step S1). Next, a surface protecting thermally-oxidized film formed of $SiO_2$ is provided on a surface of the epitaxial layer 4 (step S2). Then, a hard mask formed of SiN and $SiO_2$ is provided by the CVD method, for example, on the surface protecting thermally-oxidized film (step S3).

Next, the hard mask is patterned by the photography technique and the etching technique thereby to form the hard mask corresponding to a pattern of a peripheral trench 13 and a pattern of an alignment mark (step S4A). Then, the epitaxial layer 4 is etched through the hard mask thereby to form the peripheral trench 13 and the alignment mark (step S5A). The alignment mark is used to align positions of a photomask and a wafer in following steps where photolithography is used.

Next, an insulating film 14 formed of $SiO_2$ is provided by thermal oxidation on an entire area of inner wall surfaces (side surfaces and a bottom surface) of the peripheral trench 13 (step S6).

Next, polysilicon is deposited by the CVD method, for example, until the peripheral trench 13 is filled and the entire surface of the epitaxial layer 4 is covered (step S7). Then, polysilicon is removed from outside of the peripheral trench 13 by etch back (step S8).

Next, the surface protecting thermally-oxidized film is removed (step S31). Next, Ti is deposited on the surface of the epitaxial layer 4 by the sputtering method, for example, and this Ti layer is patterned by photolithography, thereby to form a Schottky metal 9 (step S11A). The Schottky metal 9 is formed in a manner to contact the conductor 15 and to cover an entire area of the surface of the epitaxial layer 4 in a region surrounded by the peripheral trench 13.

Next, Al is deposited on the Schottky metal 9 by the sputtering method, for example, and this Al layer is patterned by photolithography, thereby to form an electrode metal 10 (step S12A).

Next, an SiN layer is formed on surfaces of the electrode metal 10 and the epitaxial layer 4 by the CVD method, for example, and this SiN layer is patterned by photolithography, thereby to form a surface protection film 11 (step S13A). Finally, a cathode electrode 3 is formed on a rear surface of the $n^+$-type silicon substrate 2 (step S14). As a result, there can be obtained the Schottky barrier diode 1B as shown in FIGS. 10 and 11.

An effect similar to the Schottky barrier diode 1 of the first embodiment can be obtained also in the Schottky barrier diode 1B of the third embodiment. Further, in the Schottky barrier diode 1B of the third embodiment, a step of forming a field insulating film can be omitted, production thereof is easy.

Figure 13:
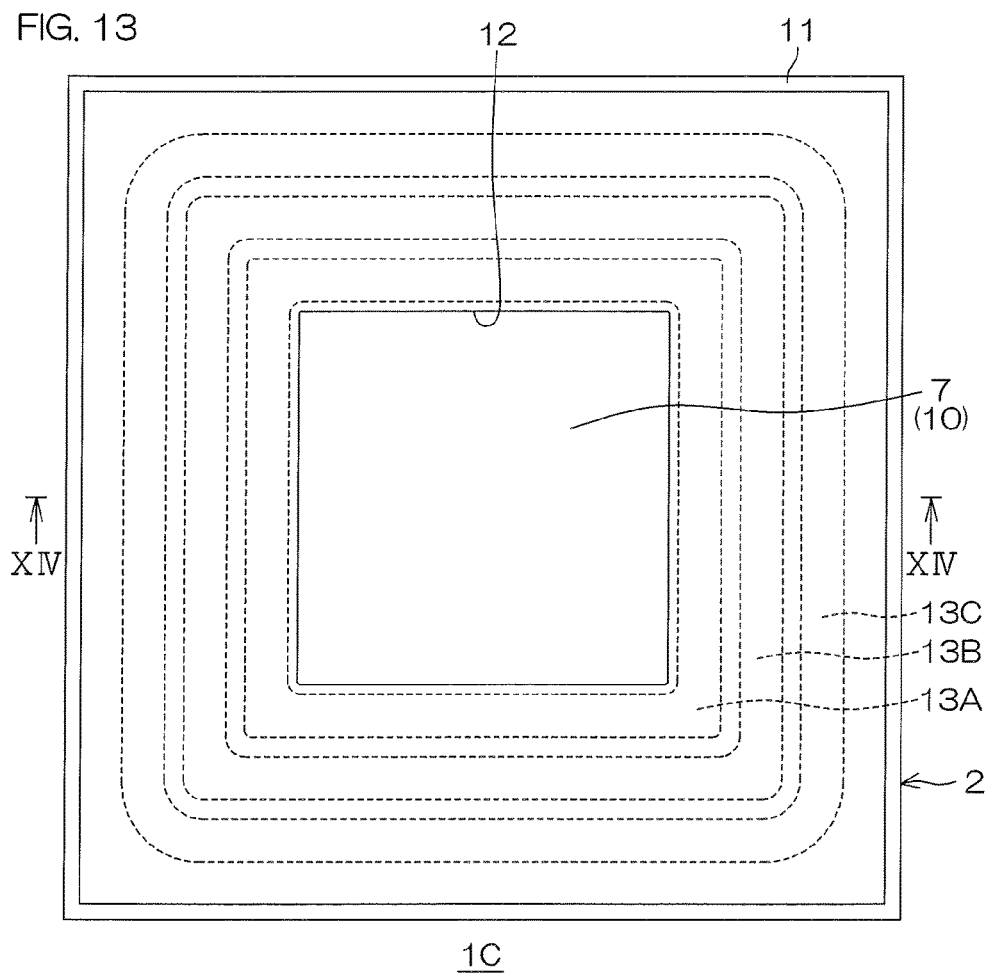
FIG. 13 is a schematic plan view showing a Schottky barrier diode according to a fourth embodiment of the present invention.
Figure 14:
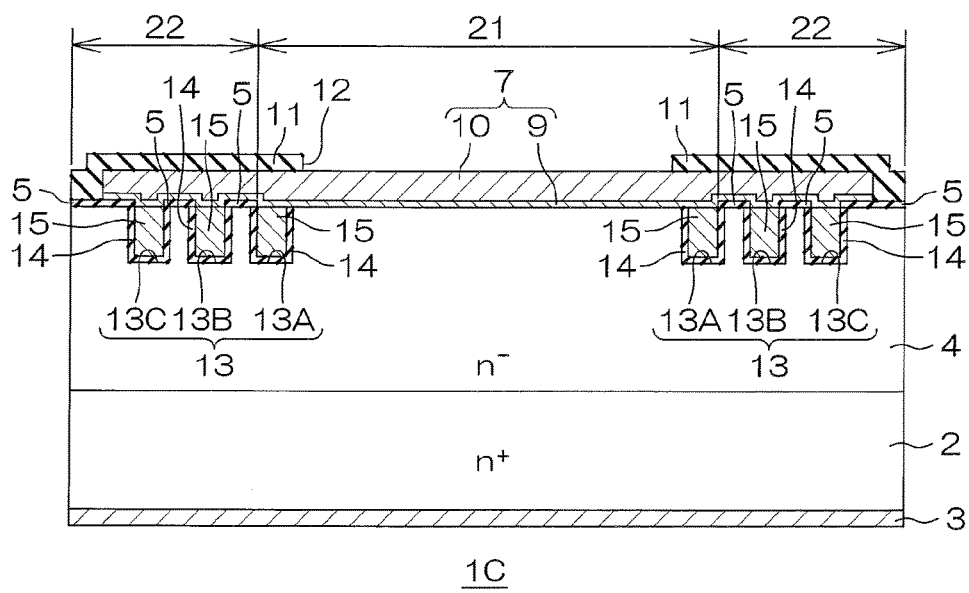
FIG. 14 is a sectional view along a line XIV-XIV in FIG. 13.

FIG. 13 is a plan view showing a Schottky barrier diode according to a fourth embodiment of the present invention. FIG. 14 is a sectional view along a line XIV-XIV in FIG. 14. Portions in FIGS. 13 and 14 corresponding to the respective portions shown in above-described FIGS. 1 and 2 have the same reference symbols.

A Schottky barrier diode 1C of the fourth embodiment is different from the Schottky barrier diode 1 of the first embodiment in that a peripheral trench 13 is configured from three peripheral trenches 13A, 13B and 13C.

Points different from the first embodiment are described more specifically below. In this Schottky barrier diode 1C, the first peripheral trench 13A, the second peripheral trench 13B and the third peripheral trench 13C dug from a surface of an epitaxial layer 4 are formed at a peripheral portion of the surface of the epitaxial layer 4 on a surface layer portion of the epitaxial layer 4. Each of the peripheral trenches 13A, 13B and 13C has a circular shape (a quadrangular endless circle in this embodiment) in plan view and is arranged at an interval. The first peripheral trench 13A is arranged at an innermost portion. The third peripheral trench 13C is arranged at an outermost portion. The second peripheral trench 13B is arranged between the first peripheral trench 13A and the third peripheral trench 13C. A bottom surface of each of the peripheral trenches 13A, 13B and 13C includes a planar surface along the surface of the epitaxial layer 4 and a surface of a semiconductor substrate 2. As a result, a section of each of the peripheral trenches 13A, 13B and 13C has a generally rectangular shape.

An entire area of inner wall surfaces (side surfaces and the bottom surface) of each of the peripheral trenches 13A, 13B and 13C is provided with an insulating film 14 formed of oxide silicon ($SiO_2$), for example. There is provided with a conductor 15 which is formed of polysilicon and is opposed to the entire area of the inner wall surfaces (the side surfaces and the bottom surface) of each of the peripheral trenches 13A, 13B and 13C via the insulating film 14 in each of the peripheral trenches 13A, 13B and 13C. The conductor 15 may be provided in a manner to fill an empty portion in each of the peripheral trenches 13A, 13B and 13C where the insulating film 14 is formed, or may be formed as a film along an inner surface of the insulating film 14.

A field insulating film 5 formed of oxide silicon ($SiO_2$), for example, is provided at a region between adjacent peripheral trenches on the surface of the epitaxial layer 4 and at an outer peripheral region of the third peripheral trench 13C on the surface of the epitaxial layer 4.

An anode electrode 7 is formed to cover a region surrounded by the first peripheral trench 13A on the surface of the epitaxial layer 4, the insulating film 14 and the conductor 15 which are exposed in an opening of each of the peripheral trenches 13A, 13B and 13C, the field insulating film 5 formed at the region between adjacent peripheral trenches, and an inner peripheral portion of the field insulating film 5 formed on the outer peripheral region of the third peripheral trench 13C.

The anode electrode 7 comprises a Schottky metal 9 which is in Schottky-contact with the surface of the epitaxial layer 4 and an electrode metal 10 laminated on this Schottky metal 9. The Schottky metal 9 is joined to the region surrounded by the first peripheral trench 13A on the surface of the epitaxial layer 4, and is connected to the conductor 15 provided in each of the peripheral trenches 13A, 13B and 13C. A surface of the electrode metal 10 opposite to a side contacting the Schottky metal 9 is planar along the surface of the epitaxial layer 4.

An outermost surface of the Schottky barrier diode 1C is provided with a surface protection film 11 formed of SiN. A center portion of the surface protection film 11 is provided with an opening 12 which exposes the electrode metal 10.

In the surface of the epitaxial layer 4, a region where the Schottky metal 9 is in Schottky-contact with the surface of the epitaxial layer 4 is an active region 21, and a region surrounding the active region 21 is a peripheral region 22. Also in the fourth embodiment, a field plate structure comprising the peripheral trenches 13A, 13B and 13C, the insulating film 14 and the conductor 15 is formed at a boundary portion between the active region 21 and the peripheral region 22 on the surface layer portion of the epitaxial layer 4, similarly to the first embodiment.

An effect similar to the Schottky barrier diode 1 of the first embodiment can be obtained also in the Schottky barrier diode 1C of the fourth embodiment.

Figure 15:
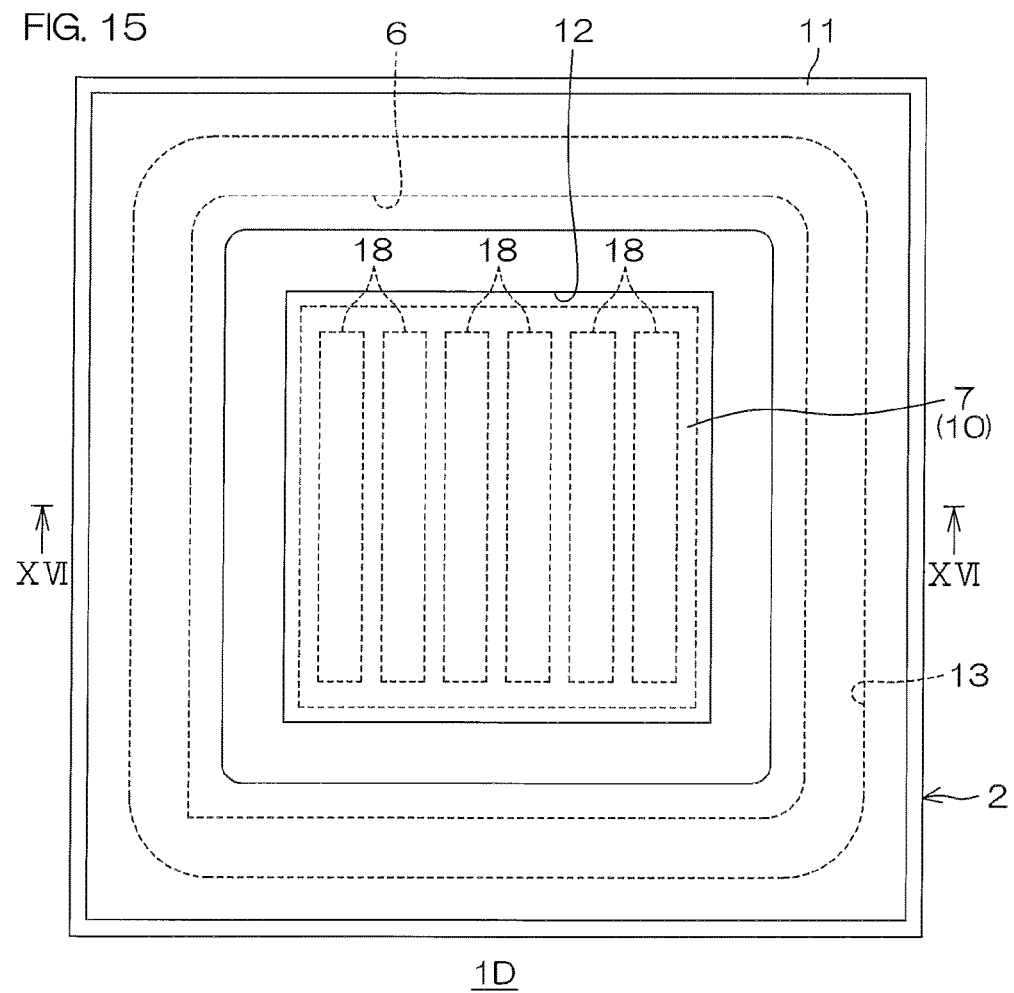
FIG. 15 is a schematic plan view showing a Schottky barrier diode according to a fifth embodiment of the present invention.
Figure 16:
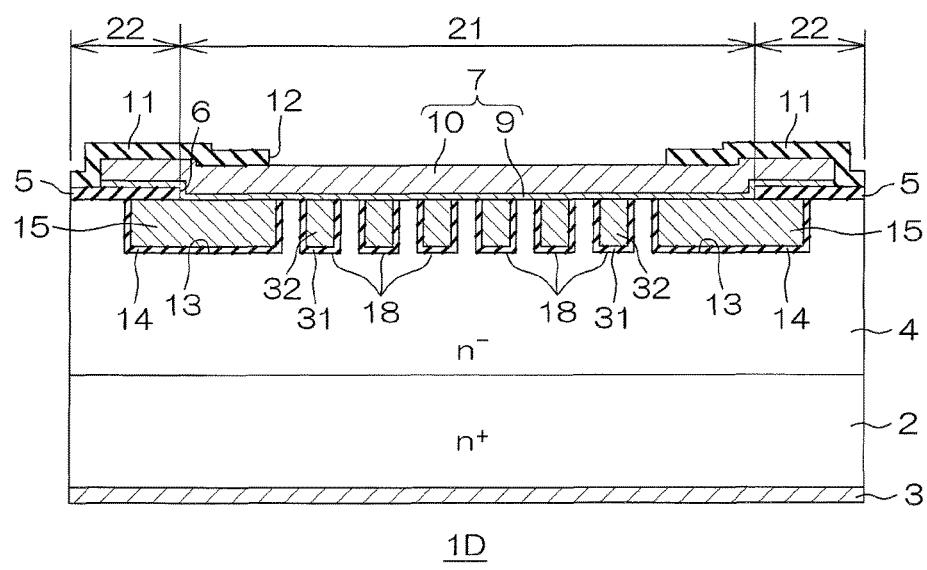
FIG. 16 is a sectional view along a line XVI-XVI in FIG. 15.

FIG. 15 is a schematic plan view showing a Schottky barrier diode according to a fifth embodiment of the present invention. FIG. 16 is a sectional view along a line XVI-XVI in FIG. 15. Portions in FIGS. 15 and 16 corresponding to the respective portions shown in above-described FIGS. 1 and 2 have the same reference symbols.

A Schottky barrier diode 1D of the fifth embodiment is different from the Schottky barrier diode 1 of the first embodiment in that a plurality of inside trenches 18 are formed on a surface layer portion of an epitaxial layer 4 in a region within an opening 6 of a field insulating film 5, an oxide film 31 is formed on inner wall surfaces (side surfaces and a bottom surface) of each of these inside trenches 18, and polysilicon 32 is embedded in each of the inside trenches 18 to contact the oxide film 31. That is, while the Schottky barrier diode 1 of the first embodiment is a planar Schottky barrier diode, the Schottky barrier diode 1D of the fifth embodiment is a trench MOS Schottky barrier diode.

Points different from the first embodiment are described more specifically below. In this Schottky barrier diode 1D, the plurality of inside trenches 18 are formed by digging the epitaxial layer 4 from the surface thereof on the surface layer portion of the epitaxial layer 4 in the region within the opening 6 of the field insulating film 5. Each inside trench 18 is a longitudinal groove extending in a predetermined direction. A bottom surface of the inside trench 18 includes a planar surface along a surface of an $n^+$-type silicon substrate 2. Therefore, a section of each inside trench 18 has a generally rectangular shape. In this embodiment, the plurality of inside trenches 18 are extended parallelly at a predetermined interval. Accordingly, these inside trenches 18 have a stripe shape in plan view. For example, side surfaces of the inside trenches 18 may be approximately parallel to a normal line of the surface of the epitaxial layer 4 (thickness direction of the epitaxial layer 4).

The oxide film 31 is formed on the inner wall surfaces (the side surfaces and the bottom surface) of each inside trench 18. The polysilicon 32 is embedded in the inside trench 18 to contact the oxide film 31.

An anode electrode 7 is extended outside of the opening 6 in a flange shape to fill the opening 6 of the field insulating film 5 and cover a peripheral portion 8 of the opening 6 in the field insulating film 5 from above. The anode electrode 7 comprises a Schottky metal 9 which is in Schottky-contact with the surface of the epitaxial layer 4 and an electrode metal 10 laminated on this Schottky metal 9. The Schottky metal 9 is joined to the surface of the epitaxial layer 4 outside the inside and peripheral trenches 18 and 13 in the region within the opening 6 of the field insulating film 5, and at the same time, is connected to the polysilicon 32 in the inside trench 18 and a conductor 15 in the peripheral trench 13. A surface of the electrode metal 10 opposite to a side contacting the Schottky metal 9 is planar along the surface of the epitaxial layer 4 (except the inner wall surfaces of the inside trench 18).

In the surface of the epitaxial layer 4, a region where the Schottky metal 9 is in Schottky-contact with the surface of the epitaxial layer 4 is an active region 21, and a region which surrounds the active region 21 is a peripheral region 22. Also in the fifth embodiment, a field plate structure comprising the peripheral trench 13, the insulating film 14 and the conductor 15 is formed on a boundary portion between the active region 21 and the peripheral region 22 in the surface layer portion of the epitaxial layer 4, similarly to the first embodiment.

An effect similar to the Schottky barrier diode of the first embodiment can be obtained also in the Schottky barrier diode 1D of the fifth embodiment.

Figure 17:
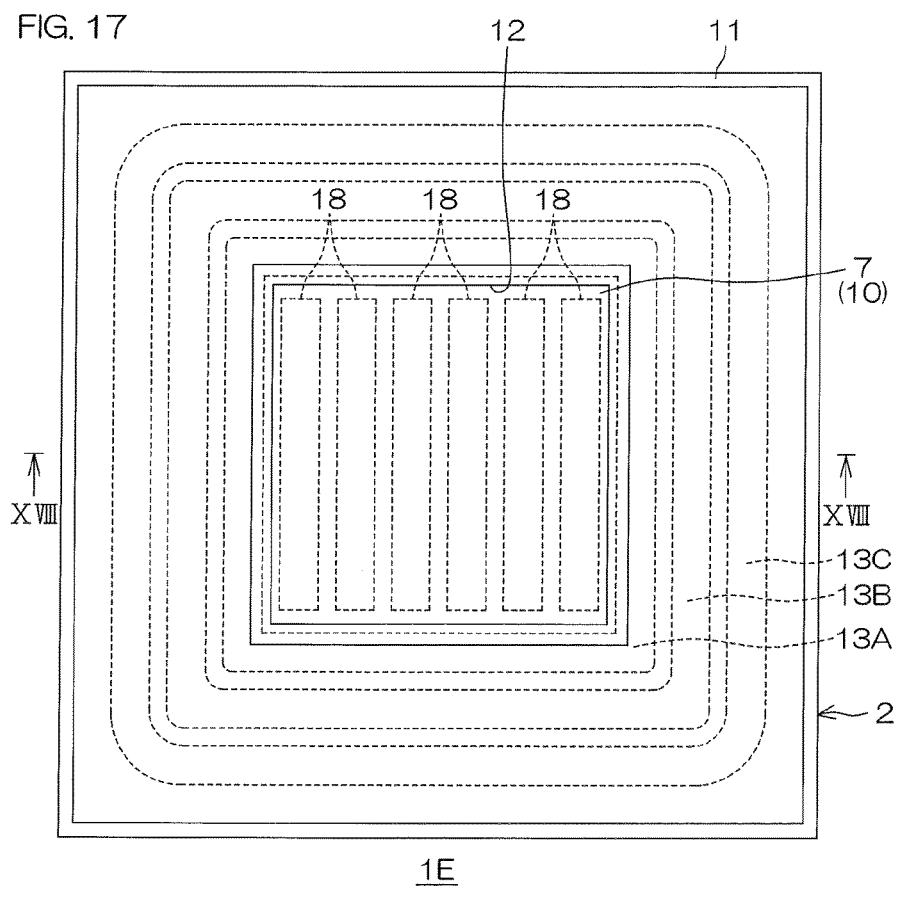
FIG. 17 is a schematic plan view showing a Schottky barrier diode according to a sixth embodiment of the present invention.
Figure 18:
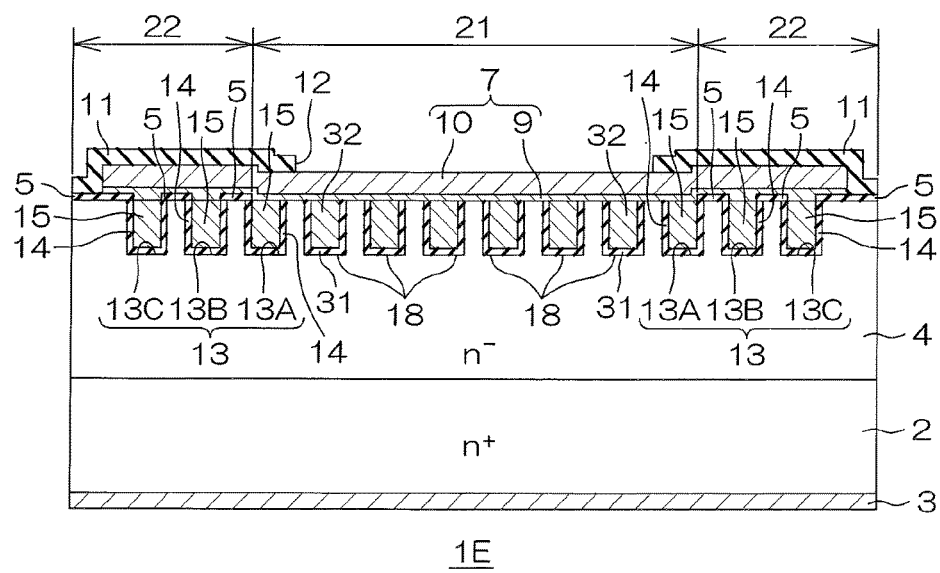
FIG. 18 is a sectional view along a line XVIII-XVIII in FIG. 17.

FIG. 17 is a plan view showing a Schottky barrier diode according to a sixth embodiment of the present invention. FIG. 18 is a sectional view along a line XVIII-XVIII in FIG. 17. Portions in FIGS. 17 and 18 corresponding to the respective portions shown in above-described FIGS. 1 and 2 have the same reference symbols.

A Schottky barrier diode 1E of the sixth embodiment is similar to the above-described Schottky barrier diode 1D of the fifth embodiment (see FIGS. 15 and 16). That is, the Schottky barrier diode 1E of the sixth embodiment is a trench MOS Schottky barrier diode. The Schottky barrier diode 1E of the sixth embodiment is different from the Schottky barrier diode 1D of the fifth embodiment in that a peripheral trench 13 is configured from three peripheral trenches 13A, 13B and 13C.

In this Schottky barrier diode 1E, the first peripheral trench 13A, the second peripheral trench 13B and the third peripheral trench 13C dug from a surface of an epitaxial layer 4 are formed at a peripheral portion of the surface of the epitaxial layer 4 on a surface layer portion of the epitaxial layer 4. Each of the peripheral trenches 13A, 13B and 13C has a circular shape (a quadrangular endless circle in this embodiment) in plan view and is arranged at an interval. The first peripheral trench 13A is arranged at an innermost portion. The third peripheral trench 13C is arranged at an outermost portion. The second peripheral trench 13B is arranged between the first peripheral trench 13A and the third peripheral trench 13C. A bottom surface of each of the peripheral trenches 13A, 13B and 13C includes a planar surface along the surface of the epitaxial layer 4 and a surface of a semiconductor substrate 2. As a result, a section of each of the peripheral trenches 13A, 13B and 13C has a generally rectangular shape.

An entire area of inner wall surfaces (side surfaces and the bottom surface) of each of the peripheral trenches 13A, 13B and 13C is provided with an insulating film 14 formed of oxide silicon ($SiO_2$), for example. There is provided with a conductor 15 which is formed of polysilicon and is opposed to the entire area of the inner wall surfaces (the side surfaces and the bottom surface) of each of the peripheral trenches 13A, 13B and 13C via the insulating film 14 in each of the peripheral trenches 13A, 13B and 13C. The conductor 15 may be provided in a manner to fill an empty portion in each of the peripheral trenches 13A, 13B and 13C where the insulating film 14 is formed, or may be formed as a film along an inner surface of the insulating film 14.

A field insulating film 5 formed of oxide silicon ($SiO_2$), for example, is provided at a region between adjacent peripheral trenches on the surface of the epitaxial layer 4 and at an outer peripheral region of the third peripheral trench 13C on the surface of the epitaxial layer 4.

Similar to the fifth embodiment, a plurality of inside trenches 18 are formed on the surface layer portion of the epitaxial layer 4 in a region surrounded by the first peripheral trench 13A, an oxide film 31 is formed on inner wall surfaces (side surfaces and a bottom surface) of each of these inside trenches 18, and a polysilicon 32 is embedded in each of the inside trenches 18 to contact this oxide film 31.

An anode electrode 7 is formed to cover the oxide film 31 and polysilicon 32 which are exposed in an opening of the inside trench 18, the surface of the epitaxial layer 4 outside the inside trench 18 in a region surrounded by the first peripheral trench 13A, the insulating film 14 and the conductor 15 which are exposed in an opening of each of the peripheral trenches 13A, 13B and 13C, the field insulating film 5 formed at the region between adjacent peripheral trenches, and an inner peripheral portion of the field insulating film 5 formed on an outer peripheral region of the third peripheral trench 13C. The anode electrode 7 comprises a Schottky metal 9 which is in Schottky-contact with the surface of the epitaxial layer 4 and an electrode metal 10 laminated on this Schottky metal 9.

The Schottky metal 9 is joined to the surface of the epitaxial layer 4 outside the inside trench 18 in the region surrounded by the first peripheral trench 13A, and at the same time, is connected to the polysilicon 32 in the inside trench 18 and the conductor 15 in each of the peripheral trenches 13A, 13B and 13C. A surface of the electrode metal 10 opposite to a side contacting the Schottky metal 9 is planar along the surface of the epitaxial layer 4 (except the inner wall surfaces of the inside trench 18).

An outermost surface of the Schottky barrier diode 1E is provided with a surface protection film 11 formed of SiN. A center portion of the surface protection film 11 is provided with an opening 12 which exposes the electrode metal 10.

In the surface of the epitaxial layer 4, a region where the Schottky metal 9 is in Schottky-contact with the surface of the epitaxial layer 4 is an active region 21, and a region surrounding the active region 21 is a peripheral region 22. Also in the sixth embodiment, a field plate structure comprising the peripheral trenches 13A, 13B and 13C, the insulating film 14 and the conductor 15 is formed at a boundary portion between the active region 21 and the peripheral region 22 on the surface layer portion of the epitaxial layer 4, similarly to the first embodiment.

An effect similar to the Schottky barrier diode 1 of the first embodiment can be obtained also in the Schottky barrier diode 1E of the sixth embodiment.

While the embodiments of this invention are described above, this invention may be implemented in further another mode. For example, while the conductor 15 is polysilicon in the above first to sixth embodiments, the conductor 15 may be a metal used for the Schottky metal 9 (titanium (Ti), molybdenum (Mo), palladium (Pd), for example) and a metal used for the electrode metal 10 (aluminum (Al), for example).

The semiconductor substrate 2 is not limited to a semiconductor substrate formed of silicone, but may be a semiconductor other than silicone. The impurity concentration of the semiconductor substrate 2 is an example, and a suitable value can be appropriately selected and used. The epitaxial layer 4 is not limited to an epitaxial layer formed of silicone, but may be an epitaxial layer other than silicone. The impurity concentration and thickness of the epitaxial layer 4 are examples, and suitable values can be appropriately selected and used.

A suitable material can be appropriately selected and used for a material of the insulating film 14. The thickness of the insulating film 14 is an example, and a suitable value can be appropriately selected and used.

While the anode electrode 7 has a two-layer structure of the Schottky metal 9 and the electrode metal 10, the anode electrode 7 may have a one-layer structure or a three or more-layer structure. A suitable material can be appropriately selected and used for a material of the Schottky metal 9 and the electrode metal 10. The thicknesses of the Schottky metal 9 and the electrode metal 10 are examples, and suitable values can be appropriately selected and used.

Further, the depth of the depletion layer formed immediately below the peripheral trench 13 at the time of applying the reverse voltage is not larger than the depth of the depletion layer formed in the active region 21.

Further, there may be employed a configuration where the conductivity type of each semiconductor portion of the above-described Schottky barrier diodes 1, 1A, 1B, 1C, 1D and 1E is reversed. For example, in the Schottky barrier diodes 1, a p-type portion may be n-type, and an n-type portion may be p-type.

While the embodiments of the present invention are described in detail, these are only examples used for clarifying technical contents of the present invention, and the present invention should not be construed in a manner limited to these concrete example, but the scopes of the present invention are only limited by the appended claims.

The present application corresponds to Japanese Patent Application No. 2014-23571 filed on Feb. 10, 2014 in Japan Patent Office, and the entire disclosure thereof is incorporated herein by reference.

What is claimed is:

1. A Schottky barrier diode, comprising:
a semiconductor substrate having a first conductivity type;
an epitaxial layer having a first conductivity type which is formed on the semiconductor substrate and has an impurity concentration lower than that of the semiconductor substrate;
a Schottky metal which is in Schottky-contact with a surface of the epitaxial layer;
a peripheral trench formed by digging from the surface of the epitaxial layer in a boundary portion between an active region where the Schottky metal is in Schottky-contact with the surface of the epitaxial layer and a peripheral region outside of the active region;
an insulating film formed directly on an entire area of inner wall surfaces of the peripheral trench and not upon the surface of the epitaxial layer;
a conductor which is not upon the surface of the epitaxial layer, is connected to the Schottky metal and is opposite to the entire area of the inner wall surfaces of the peripheral trench via the insulating film; and
wherein the inner wall surfaces of the peripheral trench include side surfaces and a bottom surface of the peripheral trench; and
wherein a depth of a depletion layer formed immediately below the peripheral trench at a time of applying a reverse voltage is the SAME as a depth of a depletion layer formed in the active region.

2. A Schottky barrier diode according to claim 1, wherein the peripheral trench has a shape of a quadrangular endless circle in plan view.

3. A Schottky barrier diode according to claim 1, wherein a depth of a depletion layer formed immediately below the peripheral trench at a time of applying a reverse voltage is not larger than a depth of a depletion layer formed in the active region.

4. A Schottky barrier diode according to claim 1, wherein the Schottky barrier diode is a planar Schottky barrier diode where the surface of the epitaxial layer being in Schottky-contact with the Schottky metal is planar.

5. A Schottky barrier diode according to claim 1, wherein a region having a second conductivity type which is different from a conductivity type of the epitaxial layer is not formed on a lower side of the peripheral trench.

6. A Schottky barrier diode according to claim 1, wherein the conductor is polysilicon.

7. A Schottky barrier diode according to claim 1, wherein a thickness of the insulating film is 0.2 μm to 0.5 μm.

8. A Schottky barrier diode according to claim 1, wherein the insulating film is formed of oxide silicon.

* * * * *